(12) United States Patent
Wang et al.

(10) Patent No.: US 9,111,874 B2
(45) Date of Patent: Aug. 18, 2015

(54) SEMICONDUCTOR STRUCTURES AND FABRICATION METHOD THEREOF

(71) Applicants: SEMICONDUCTOR MANUFACTURING INTERNATIONAL (BEIJING) CORPORATION, Beijing (CN); Semiconductor Manufacturing International (Shanghai) Corporation, Shanghai (CN)

(72) Inventors: Dongjiang Wang, Shanghai (CN); Steven Zhang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/228,485

(22) Filed: Mar. 28, 2014

(65) Prior Publication Data

US 2015/0087150 A1      Mar. 26, 2015

(30) Foreign Application Priority Data

Sep. 24, 2013   (CN) .......................... 2013 1 0439583

(51) Int. Cl.
  *H01L 21/308*     (2006.01)
(52) U.S. Cl.
  CPC .................................. *H01L 21/3086* (2013.01)
(58) Field of Classification Search
  None
  See application file for complete search history.

(56) References Cited

U.S. PATENT DOCUMENTS

| | | | | |
|---|---|---|---|---|
| 4,613,400 A * | 9/1986 | Tam et al. | ...................... | 216/46 |
| 4,871,630 A * | 10/1989 | Giammarco et al. | ........... | 430/14 |
| 5,332,653 A * | 7/1994 | Cullen et al. | .................. | 430/323 |
| 6,103,588 A * | 8/2000 | Jeng et al. | ..................... | 438/399 |
| 6,121,154 A * | 9/2000 | Haselden et al. | ............. | 438/724 |
| 6,818,519 B2 * | 11/2004 | Fang et al. | ..................... | 438/301 |
| 7,541,291 B2 * | 6/2009 | Kang et al. | .................... | 438/717 |
| 7,772,122 B2 * | 8/2010 | Cirigliano et al. | ............ | 438/696 |
| 8,172,948 B2 * | 5/2012 | Heo et al. | ...................... | 118/715 |
| 8,883,648 B1 * | 11/2014 | Hsieh et al. | .................... | 438/703 |
| 2005/0118531 A1 * | 6/2005 | Lee et al. | ...................... | 430/311 |
| 2006/0290012 A1 * | 12/2006 | Sadjadi | ................. | 257/E21.235 |
| 2007/0042607 A1 * | 2/2007 | Sadjadi et al. | ................ | 438/715 |
| 2007/0284690 A1 * | 12/2007 | Sadjadi et al. | ................ | 257/499 |
| 2010/0055621 A1 * | 3/2010 | Hatakeyama et al. | ........ | 430/323 |
| 2011/0217838 A1 * | 9/2011 | Hsieh et al. | ................... | 438/618 |
| 2013/0237050 A1 * | 9/2013 | Kikutani | ...................... | 438/618 |

\* cited by examiner

*Primary Examiner* — Allan Olsen
(74) *Attorney, Agent, or Firm* — Anova Law Group, PLLC

(57) ABSTRACT

A method is provided for fabricating a semiconductor structure. The method includes providing a to-be-etched layer; and forming a hard mask layer on the to-be-etched layer. The method also includes forming a photoresist layer on the hard mask layer; and forming a patterned photoresist layer having openings exposing the hard mask layer by exposing and developing the photoresist layer. Further, the method includes forming sidewall spacers on side surfaces of the openings; and forming a patterned hard mask layer by etching the hard mask layer using the patterned photoresist layer and the sidewall spacers as an etching mask such that patterns in the hard mask layer have a substantially right angle at edge. Further, the method also includes forming to-be-etched patterns by etching the to-be-etched layer based on the patterned hard mask layer.

20 Claims, 4 Drawing Sheets

SEMICONDUCTOR STRUCTURES AND FABRICATION METHOD THEREOF

CROSS-REFERENCES TO RELATED APPLICATIONS

This application claims the priority of Chinese patent application No. 201310439583.3, filed on Sep. 24, 2013, the entirety of which is incorporated herein by reference.

FIELD OF THE INVENTION

The present invention generally relates to the field of semiconductor manufacturing technology and, more particularly, relates to semiconductor structures and fabrication techniques thereof.

BACKGROUND

In a semiconductor fabrication process, it is common to form designed patterns by etching a substrate and/or a to-be-etched layer using a patterned photoresist layer as an etching mask. The patterned photoresist layer may be formed by exposing and developing a photoresist layer.

With the continuous development of the semiconductor process, the size of semiconductor devices have been continuously shrunk; and the minimum line width of the patterned photoresist layer has also become smaller and smaller. Further, in order to match the requirements of shrinking the minimum line width of the photoresist layer, the thickness and the hardness of the photoresist layer have also been continuously reduced, thus it has become more and more difficult to control the line width roughness (LWR) of the patterned photoresist layer. In an etching process, the photoresist near to the top of an opening may become slanting because of the effect of the etching gas. That is, the right angles at the top of the photoresist patterns may become round angles. Such round angles may affect the side surface morphology of the patterns formed by a subsequent etching process.

Further, because the photoresist near to the top of the opening may become slanting; and/or may be partially removed because of the etching process, the size of the openings may be greater than the designed size, and as a result, the subsequently formed patterns in a to-be-etched layer may be greater than the designed size.

Further, when the device densities at different positions of a substrate are different, the size of the patterns formed by an etching process using the photoresist having a same pattern size as an etching mask may also be different. Therefore, the electrical properties of the semiconductor devices may be significantly affected. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a to-be-etched layer; and forming a hard mask layer on the to-be-etched layer. The method also includes forming a photoresist layer on the hard mask layer; and forming a patterned photoresist layer having openings exposing the hard mask layer by exposing and developing the photoresist layer. Further, the method includes forming sidewall spacers on side surfaces of the openings; and forming a patterned hard mask layer by etching the hard mask layer using the patterned photoresist layer and the sidewall spacers as an etching mask such that patterns in the hard mask layer have a substantially right angle at edge. Further, the method also includes forming to-be-etched patterns by etching the to-be-etched layer based on the patterned hard mask layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

When photoresist is used as an etching mask to etch a to-be-etched material layer, due to the effect of the etching gas, the photoresist on the top of an opening may become slanting. That is, the cross-section view of the patterns may become from right angles to round angles; and the size of the opening may become bigger.

Further, the device densities at different positions of the substrate may be different, when photoresist having openings with a same size are used to form patterns, the size of the patterns may be different. The size difference may be caused by an etch bias loading effect. At the positions of the substrate having a relatively large device density, etch of the openings in the photoresist layer may contact with a relatively small amount of etching gas, thus the amount of the photoresist etched away by the etching gas may be relatively small; and the opening size bias of the photoresist may be relatively small. At the positions of the substrate having a relatively small device density, etch of the openings in the photoresist layer may contact with a relatively large amount of etching gas, thus the amount of the photoresist etched away by the etching gas may be relatively large; and the opening size bias of the photoresist may be relatively large. Such opening size biases at different positions of the substrate may cause the patterns formed by an etching process using the photoresist with a same opening size to have different sizes, thus the electrical properties of the semiconductor devices formed by using the photoresist may be significantly affected. Such etch bias loading effect and other issues may be overcome by forming sidewall spacers on side surfaces of the openings in a photoresist layer.

Figure 7:
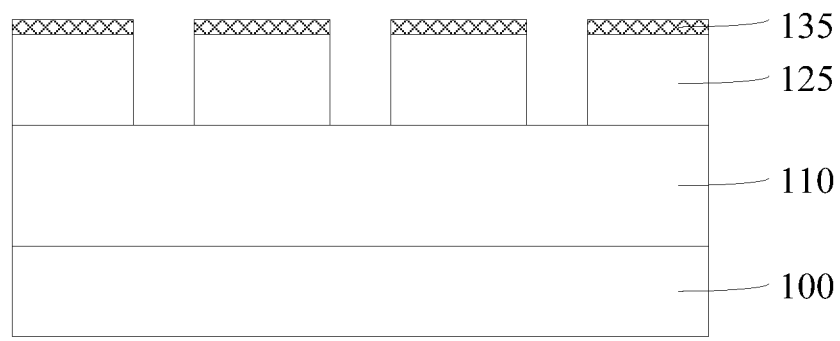
Figure 8:
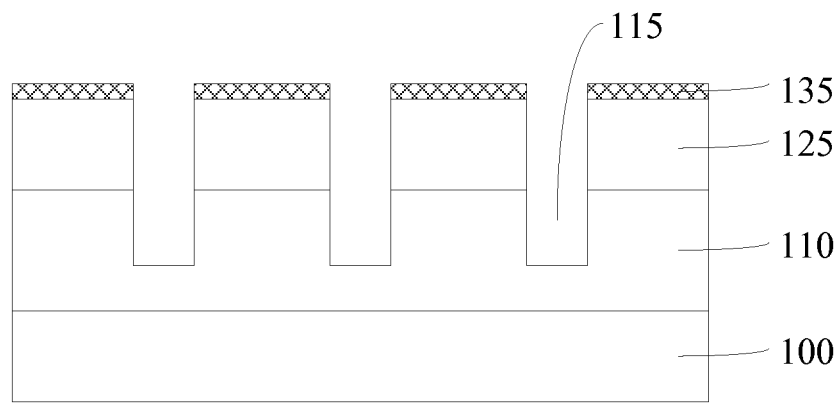
Figure 9:
FIG. 9 illustrates an exemplary fabrication process of a semiconductor structure consistent with the disclosed embodiments.

FIG. 9 illustrates an exemplary fabrication process of a semiconductor structure; and FIGS. 1~8 illustrate exemplary semiconductor structures corresponding to various stages of the fabrication process.

Figure 1:
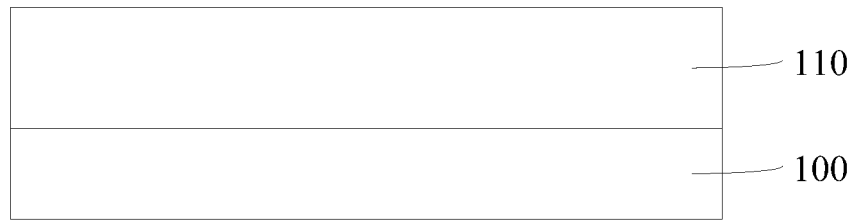
FIGS. 1~8 illustrate semiconductor structures corresponding to certain stages of an exemplary fabrication process of a semiconductor structure consistent with the disclosed embodiments.

As shown in FIG. 9, at the beginning of the fabrication process, a substrate with certain structures is provided (S101). FIG. 1 illustrates a corresponding semiconductor structure.

As shown in FIG. 1, a substrate 100 is provided. A to-be-etched layer 110 is formed on the surface of the substrate 100.

The substrate 100 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor, etc. The substrate 100 may also include sapphire, or glass, etc. The substrate 100 provides a base for subsequent processes and structures.

In certain other embodiments, the substrate 100 may include a semiconductor substrate and one or more layers of dielectric material, or metal layer, etc., formed on the semiconductor substrate.

The to-be-etched layer 110 may be made of any appropriate material, such as poly silicon, interlayer dielectric layer material, or metal layer, etc. In one embodiment, the to-be-etched layer 110 is made of poly silicon.

Various processes may be used to form the to-be-etched layer 110, such as a chemical vapor deposition (CVD) process, a physical vapor deposition (PVD) process, an atomic layer deposition (ALD) process, a flowable chemical vapor deposition (FCVD) process, an electro plating process, or a sputtering process, etc.

In certain other embodiments, the to-be-etch layer 110 may be a portion of the substrate 100. The portion of the substrate 100 may be subsequently etched to form patterns using a subsequently formed organic distribution layer as a mask.

Figure 2:
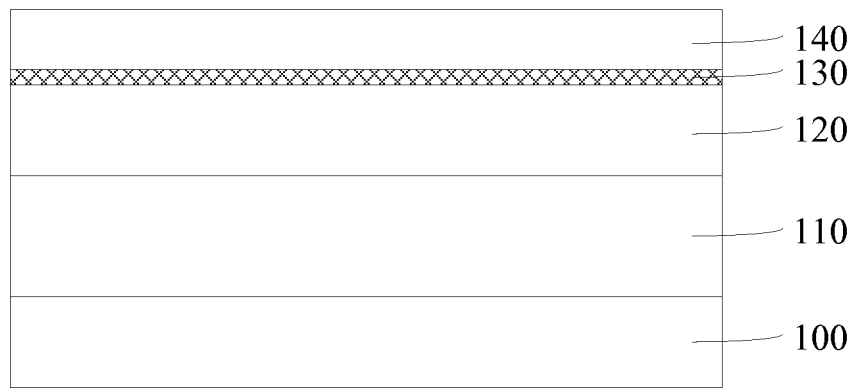

Returning to FIG. 9, after providing the substrate 100 and forming the to-be-etched layer 110, an organic distribution layer, a hard mask layer and a photoresist layer may be sequentially formed (S102). FIG. 2 illustrates a corresponding semiconductor structure.

As shown in FIG. 2, an organic distribution layer (ODL) 120 is formed on the surface of the to-be-etched layer 110; a hard mask layer 130 is formed on the surface of the organic distribution layer 120; and a photoresist layer 140 is formed on the surface of the hard mask layer 120. The organic distribution layer 120, the hard mask layer 130 and the photoresist layer 140 may be used as etching masks for forming patterns in the to-be-etched layer 110, thus the process for forming the patterns may be referred as a tri-layer patterning process.

The organic distribution layer 120 may be formed between the hard mask layer 130 and the to-be-etched layer 110, thus the organic distribution layer 120 may be used as an etching stop layer for subsequently etching the hard mask layer 130. Using the organic distribution layer 120 as an etching stop layer may avoid an over-etching effect onto the to-be-etched layer 110 when the hard mask layer 130 is etched. Further, the organic distribution layer 120 may be made of an organic material, a non-fluoride etching gas may be used to subsequently etch the organic distribution layer 120 to form certain patterns, the no-fluoride etching gas may not affect the hard mask layer 130 and the to-be-etched layer 110 when the organic distribution layer 120 is being etched, thus a relatively thin hard mask layer 130 may be used as a mask to etch the relatively thick organic distribution layer 120. Further, when the etched relatively thick organic distribution layer 120 is used as an etching mask to etch the to-be-etched layer 110, and/or the substrate 100, it may be successful to obtain relatively deep patterns, such as through-silicon holes, etc.; and it may be unnecessary to consider the unfavorable effects caused by a relatively thick hard mask layer and a relatively thick photoresist layer.

Various processes may be used to form the organic distribution layer 120. In one embodiment, the organic distribution layer 102 may be formed by forming a uniform liquid organic distribution material layer on the surface of the to-be-etched layer 110 by a spin-coating process; and followed by a thermal solidification process. Thus, the organic distribution layer 120 may be formed on the surface of the to-be-etched layer 110.

In certain other embodiments, the organic distribution layer 120 may be omitted; the hard mask layer 130 may be directly formed on the surface of the to-be-etched layer 110. The to-be-etched layer 110 may be subsequently etched using the etched hard mask layer 130 as an etching mask.

The hard mask layer 130 may be made of any appropriate material, such as one or more of silicon oxide, silicon nitride, silicon oxynitride, titanium nitride, or tantalum nitride, etc.

With the continuous shrinkage of semiconductor devices, the thickness of the photoresist layer used for fabricating the semiconductor devices may correspondingly be reduced; and the hardness of the photoresist layer may also decrease. At the same time, some patterns may be relatively deep. Thus, when the photoresist layer is directly used as an etching mask to etch a to-be-etched layer, the photoresist layer may be completely consumed up before the etching process is completed.

In the present invention, the hard mask layer 130 may be formed between the to-be-etched layer 110 and the photoresist layer 130, because the thickness of the hard mask layer 130 may relatively small, it may be easy to pattern the hard mask layer using the photoresist layer 130. Further, the material of hard mask layer 130 may be different from the material of the to-be-etched layer 110, the hard mask layer 130 and the to-be-etched layer 110 may have a significantly high etching selectivity, thus it may be successful to etch the to-be-etched layer 110 to form designed patterns by using a relatively thin hard mask layer 130.

Various processes may be used to form the hard mask layer 130, such as a CVD process, a PVD process, or a sputtering process, etc.

The thickness of the organic distribution layer 120 may be in a range of approximately 1000 Å~2000 Å. The thickness of the hard mask layer 130 may be in a range of approximately 200 Å~800 Å. Because the thickness of the organic distribution layer 120 may be greater than the thickness of the hard mask layer 130, relatively deep patterns, such as trenches, or through holes, etc., may be subsequently obtained by using the patterned organic distribution layer 120 as an etching mask. In certain other embodiments, the thickness of the organic distribution layer 120 and the thickness of the hard mask layer 130 may be other appropriate values.

Referring to FIG. 2, in one embodiment, the photoresist layer 140 may be directly formed on the surface of the hard mask layer 130. In certain other embodiments, a bottom anti-reflection (BARC) layer (not shown) may be formed on the hard mask layer 130; and the photoresist layer 140 may be formed on the surface of the bottom anti-reflection layer. The bottom anti-reflection layer may reduce the light reflection on the bottom surface of subsequently formed photoresist openings during the photo exposure process, thus it may aid to control the size of the photoresist openings.

The bottom anti-reflection layer may include organic bottom anti-reflection layer, silicon oxide, silicon nitride, or silicon oxynitride, etc.

Various processes may be used to form the bottom anti-reflection layer, such as a CVD process, a PVD process, an FCVD process, or a spin-coating process, etc.

Figure 3:
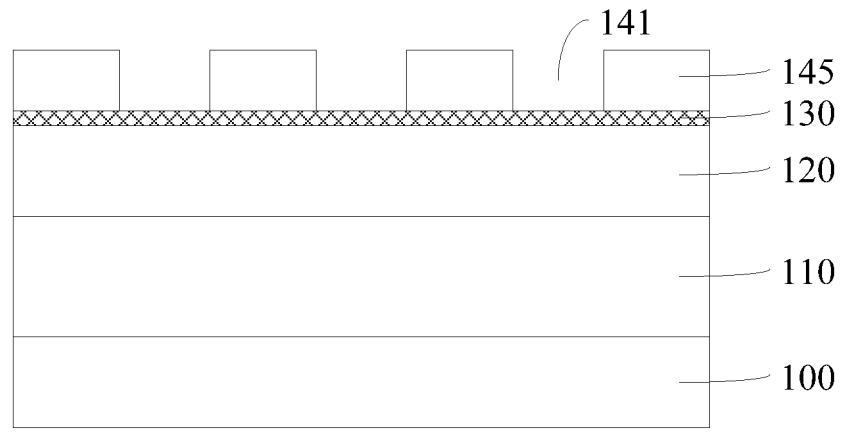

Returning to FIG. 9, after forming the organic distribution layer 120, the hard mask layer 130 and the photoresist layer 140, a patterned photoresist layer may be formed (S103). FIG. 3 illustrates a corresponding semiconductor structure.

As shown in FIG. 3, a patterned photoresist layer 145 having a plurality of openings 141 is formed. The patterned photoresist layer 145 may be formed by exposing and developing the photoresist layer 140 to form the openings 141 in the photoresist layer 140. The openings 141 may expose portions the surface of the hard mask layer 130. The size and the positions of the openings 141 may correspond to the size and the positions of subsequently formed patterns in the to-be-etched layer 110.

Figure 4:
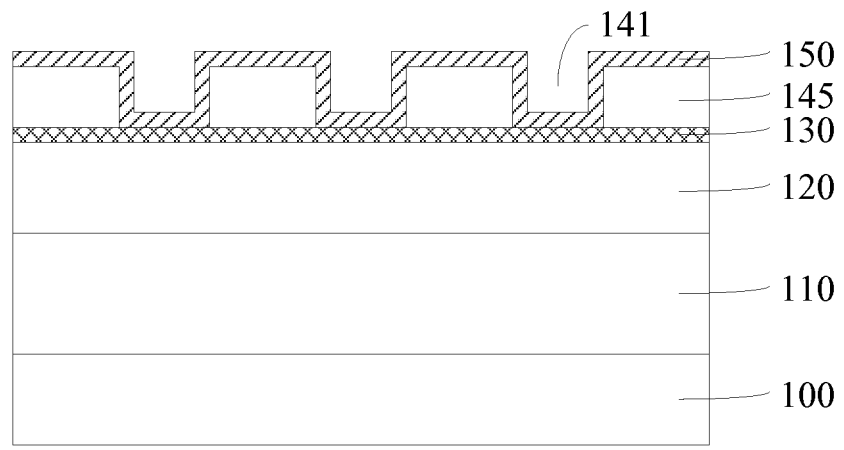

Returning to FIG. 9, after forming the patterned photoresist layer 145, a sidewall spacer material layer may be formed (S104). FIG. 4 illustrates a corresponding semiconductor structure.

As shown in FIG. 4, a sidewall spacer material layer 150 is formed on the surface of the patterned photoresist layer 145 and the surface of the hard mask layer 130 exposed by the openings 141.

The sidewall spacer material layer 150 may be made of any appropriate material, such as silicon oxide, silicon nitride, silicon oxynitride, titanium nitride, or tantalum nitride, etc. The sidewall spacer material layer 150 may be a single layer structure, or a multiple-stacked structure. The thickness of the sidewall spacer material layer 150 may be equal to, or smaller than 50 Å.

Various processes may be used to form the sidewall spacer material layer 150, such as a CVD process, a PVD process, an ALD process, or an FCVD process, etc.

In one embodiment, the sidewall spacer material layer 150 is made of silicon oxide; and formed by a CVD process. Specifically, the reaction gases the CVD process may include $NH_3$, and $SiCl_4$, etc. The flow of the reaction gases of the CVD process may be in a range of approximately 10 sccm~1000 sccm. The temperature of the reaction chamber of the CVD process may be in a range of approximately 200° C.~800° C. The pressure of the reaction chamber of the CVD process may be in a range of approximately 3 mTorr~1 Torr.

Figure 5:
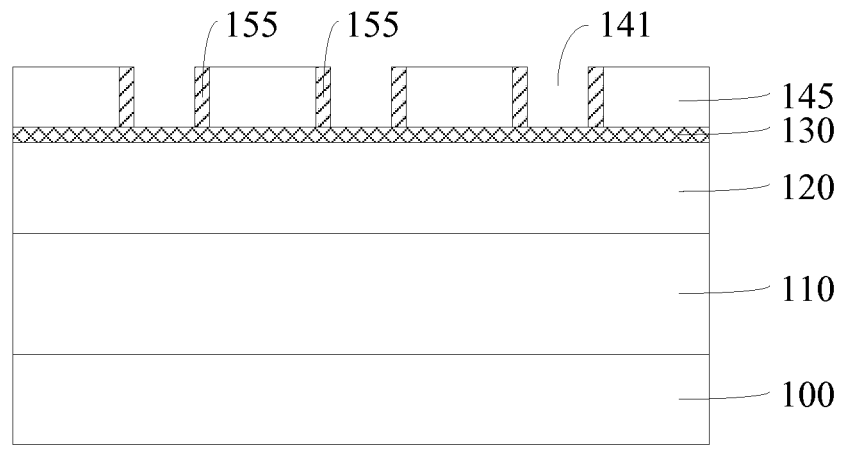

Returning to FIG. 9, after forming the sidewall spacer material layer 150, sidewall spacers may be formed (S105). FIG. 5 illustrates a corresponding semiconductor structure.

As shown in FIG. 5, sidewall spacers 155 are formed on the side surfaces of the openings 141 in the patterned photoresist layer 145.

The sidewall spacers 155 may be formed by an etch back process. Because the sidewall spacer material layer 150 on the side surfaces of the openings 141 may be difficult to be removed, after the etch back process, the sidewall spacer material layer 150 on the top surface of the patterned photoresist layer 145 and the surface of the hard mask layer 130 may be removed. Thus, the sidewall spacers 155 on the side surfaces of the openings 141 may be formed.

Various processes may be used as the etch back process, such as a dry etching process, a wet etching process, or an ion beam etching process, etc. In one embodiment, a dry etching process is used for the etch back process. The etching gas of the dry etching process may have a significantly high etching selectivity ratio to the sidewall spacer material layer 150, the hard mask layer 130 and the patterned photoresist layer 145, so that the etch back process may have minimum damages to the surface of the hard mask layer 130 and the top surface of the patterned photoresist layer 145.

Because of the protection of the sidewall spacers 155, the photoresist of the patterned photoresist layer 145 near to the openings 141 may be difficult to be removed by a subsequent etching process. Thus, after the subsequent etching process, the sidewalls of the patterned photoresist layer 145 near to the openings 141 may be still vertical to the surface of substrate 100; and the sidewall morphology of the subsequently formed patterns may be improved. Further, because the photoresist of the patterned photoresist layer 145 near to the openings 141 may be difficult to be removed by a subsequent etching process, that is, not mater the positions having the relatively large device density or the positions having the relatively small device density, the size of the openings 141 may be barely changed after the subsequent etching process. Therefore, the uniformity of the electrical properties of the finally formed semiconductor devices may be improved.

Figure 6:
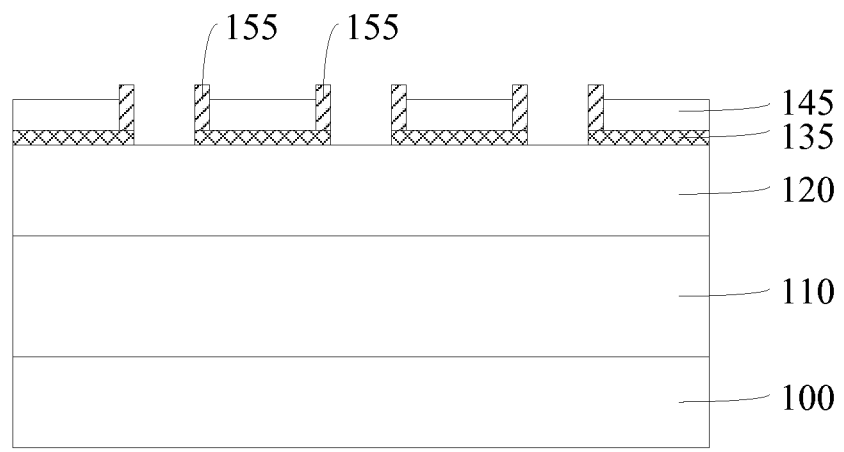

Returning to FIG. 9, after forming the sidewall spacers 155, a patterned hard mask layer may be formed (S106). FIG. 6 illustrates a corresponding semiconductor structure.

As shown in FIG. 6, a patterned hard mask layer 135 is formed. The patterned hard mask layer 135 may be formed by etching the hard mask layer 130 using the patterned photoresist layer 145 and the sidewall spacers 155 as an etching mask. The patterned hard mask layer 135 may expose portions of the surface of the organic distribution layer 120.

Various processes may be used to etch the hard mask layer 130, such as a dry etching process, a wet etching process, or an ion beam etching process, etc. In one embodiment, a dry etching process is used to etch the hard mask layer 130 until the surface of the organic distribution layer 120 is exposed. Thus, the patterned mask layer 135 may be formed.

In certain other embodiments, when a back anti reflection layer is formed between the photoresist layer 140 and the hard mask layer 130, the bottom anti reflection layer and the hard mask layer 130 may be sequentially etched until the surface of the organic distribution layer 120 is exposed. Thus, a patterned bottom anti reflection layer and the patterned hard mask layer 135 may be formed.

In one embodiment, the dry etching process may have a less than 1 etching selectivity ratio to the sidewall spacer 155 and the patterned photoresist layer 145, when the patterned hard mask layer 135 is formed, a partial thickness of the patterned photoresist layer 145 and a partial height of the sidewall spacers 155 may be etched. However, the remained sidewall spacers 155 may higher than the remained patterned photoresist layer 145, the remained sidewall spacers 155 may still be able to prevent the patterned photoresist layer 145 near to the openings 141 from becoming slanting caused by an over-etching. Thus, the size of the finally obtained patterns may not be affected by the un-uniformity of the device density.

In certain other embodiments, etching selectivity ratio between the sidewall spacer 155 and the patterned photoresist layer 145 in the dry etching process may be equal to 1 or greater than 1 and, when the patterned hard mask layer 135 is formed, a partial thickness of the patterned photoresist layer 145 and a partial height of the sidewall spacers 155 may be etched. The height of the remained sidewall spacers 155 may equal to, or smaller than the thickness of the remained patterned photoresist layer 145, but the remained sidewall spacers 155 may still be able to prevent the patterned photoresist layer 145 near to the openings 141 from becoming slanting caused by an over-etching to a certain extent. Thus, the size of the finally obtained patterns may not be affected by the un-uniformity of the device density.

Returning to FIG. 9, after forming the patterned hard mask layer 135, a patterned organic distribution layer may be formed (S107). FIG. 7 illustrates a corresponding semiconductor structure.

As shown in FIG. 7, a patterned organic distribution layer 125 is formed. The patterned organic distribution layer 125 may be formed by etching the organic distribution layer 120 until portions of the surface of the to-be-etched layer 110 are exposed. The remained sidewall spacers 155 and the remained patterned photoresist layer 145 may be removed after the patterned organic distribution layer 125 is formed.

In one embodiment, because the remained patterned photoresist layer 145 may be removed when the organic distribution layer 120 is being etched to form the patterned organic distribution layer 125, it may be unnecessary to remove the patterned photoresist layer 145 by an extra process; and the organic distribution layer 120 may be directly etched using the patterned hard mask layer 135 as an etching mask. Further, the sidewall spacers 155 may be relatively thin, when the patterned photoresist layer 145 is removed, the sidewall spacers 155 may be removed simultaneously.

Various processes may used to etch the organic distribution layer 120 to form the patterned organic distribution layer 125, such as a dry etching process, a wet etching process, or an ion beam etching process, etc. In one embodiment, a plasma dry etching process is used to etch the organic distribution layer 120.

The etching gas of the dry etching process may be an oxidizing etching gas, a fluorine etching gas, or a mixture of oxidizing etching gas and fluorine etching gas, etc.

The oxidizing etching gas may include $O_2$, CO and $SO_2$, etc. The oxidizing etching gas may be one or more of the oxidizing gas mixed with one or more of $N_2$ and $H_2$, etc. The oxidizing etching gas may barely damage the patterned hard mask layer 135 and the to-be-etched layer 110, thus it may only need a relatively thin patterned hard mask layer 135 to etch the organic distribution layer 130 to form the patterned organic distribution layer 135. The patterned photoresist layer 145 may be enough to be used as an etching mask layer to etch the relatively thin hard mask layer 130 to form the patterned hard mask layer 135. The patterned organic distribution layer 125 may be used to subsequently form relatively deep patterns. Therefore, it may be successful to form relatively deep patterns using the patterned photoresist layer 145.

The fluorine etching gas may include any fluorine element which is appropriate for semiconductor etching, such as $Cl_2$, $F_2$, HF, $CF_4$, $C_4F_8$, $Cl_2$, or $SF_6$, etc.

In one embodiment, the etching gas includes one or more of $CF_4$, $CHF_3$, $Cl_2$, and HBr. The flow of the etching gas may be in a range of approximately 10 sccm~300 sccm. The radio frequency power of the plasma etching process may be in a range of 200 W~1200 W. The pressure of the reaction chamber may be in a range of approximately 2 mTorr~200 mTorr. The temperature of the reaction chamber may be in a range of approximately 10° C.~100° C.

Returning to FIG. 9, after forming the patterned organic distribution layer 125, to-be-etched patterns may be formed (S108). FIG. 8 illustrates a corresponding semiconductor structure.

As shown in FIG. 8, a plurality of to-be-etched patterns 115 are formed in the to-be-etched layer 110. The to-be-etched patterns 115 may be formed by etching the to-be-etched layer 110 using the patterned hard mask layer 135 and the patterned organic distribution layer 125 as an etching mask. The to-be-etched patterns 115 may correspond to the designed patterns on the patterned photoresist layer 145. By forming the sidewall spacers 155 on the side surfaces of the openings 141 in the patterned photoresist layer 145, the etch loading bias effect may be significantly reduced. Thus, the size difference between the designed patterns and the formed patterns (the to-be-etched patterns 115) may be significantly minimized.

The to-be-etched layer 110 may be etched by any appropriate process, such as a dry etching process, a wet etching process, or an ion beam etching process, etc.

In certain other embodiments, the patterned hard mask layer 135 may be removed firstly, only the patterned organic distribution layer 125 may be used as an etching mask to form the to-be-etched patterns 115.

After forming the to-be-etched patterns 115, the patterned organic distribution layer 125 and the patterned hard mask layer 135 may be removed. The patterned organic distribution layer 125 and the patterned hard mask layer 135 may be stripped off by a dry etching process, a wet etching process, or a plasma ashing process, etc.

The to-be-etched patterns 115 may be portions of semiconductor devices, such as gate structures of the transistors, or fin structures of fin FET transistors. The to-be-etched patterns may also be structures of MEMS devices. Further, the to-be-etched patterns may be used as mask for making other devices and structures.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a to-be-etched layer for making the semiconductor structure;
   forming a hard mask layer on the to-be-etched layer;
   forming a photoresist layer on the hard mask layer;
   forming a patterned photoresist layer having openings exposing the hard mask layer by exposing and developing the photoresist layer;
   forming sidewall spacers on side surfaces of the openings;
   forming a patterned hard mask layer by etching the hard mask layer using the patterned photoresist layer and the sidewall spacers as an etching mask such that patterns in the hard mask layer have a substantially 90 degree angle at edge,
   wherein, while etching the hard mask layer, the patterned photoresist layer and the sidewall spacers are also etched such that remaining sidewall spacers have a height greater than remaining patterned photoresist layer over the to-be-etched layer; and
   forming to-be-etched patterns by etching the to-be-etched layer based on the patterned hard mask layer.

2. The method according claim 1, wherein:
   the to-be-etched layer is formed on a substrate.

3. The method according to claim 1, wherein:
   the sidewall spacers are made of silicon oxide, silicon nitride, silicon oxynitride, titanium nitride, or tantalum nitride.

4. The method according to claim 1, before forming the photoresist layer, further including:
   forming a bottom anti-reflection layer on the hard mask layer.

5. The method according to claim 1, wherein:
   a thickness of the hard mask layer is in range of approximately 200 Å to 800 Å.

6. The method according to claim 1, wherein:
   the hard mask layer is a single layer structure, or a multiple-stacked structure; and
   the hard mask layer is made of one or more of silicon oxide, silicon nitride, silicon oxynitride, titanium nitride, or tantalum nitride.

7. The method according to claim 1, wherein:
   the hard mask layer is etched by a dry etching process.

8. The method according to claim 1, wherein:
the to-be-etched patterns are formed by etching the to-be-etched layer using the hard mask layer as an etching mask.

9. The method according to claim 1, wherein forming the sidewall spacers further includes:
forming a sidewall spacer material layer on the patterned photoresist layer and portions of a surface of the hard mask layer exposed by the openings; and
performing an etch back process onto the sidewall spacer material layer.

10. The method according to claim 9, wherein:
the sidewall spacer material layer is formed by an atomic layer deposition process, a physical vapor deposition process, or a chemical vapor deposition process.

11. The method according to claim 9, wherein:
the sidewall spacer material layer is made of silicon nitride;
the sidewall spacer material layer is formed by a chemical vapor deposition process;
a source gas of the chemical vapor deposition process includes $NH_3$ and $SiCl_4$;
a flow of the source gas is in a range approximately of 10 sccm to 1000 sccm;
a temperature in a reaction chamber of the chemical vapor deposition process is in a range of approximately 200° C. to 800° C.; and
a pressure of the reaction chamber of the chemical vapor deposition process is in a range of approximately 3 mTorr to 1 Torr.

12. The method according to claim 1, before forming the hard mask layer, further including:
forming an organic distribution layer made by an organic material on the to-be-etched layer.

13. The method according to claim 12, wherein:
a thickness of the organic distribution layer is in a range of approximately 1000 Å to 2000 Å.

14. The method according to claim 12, wherein:
a patterned organic distribution layer is formed by etching the organic distribution layer using the patterned hard mask layer as an etching mask.

15. The method according to claim 14, wherein:
the to-be-etched patterns are formed by etching the to-be-etched layer using the patterned organic distribution layer as an etching mask.

16. The method according to claim 14, wherein:
the patterned organic distribution layer is formed by a dry etching process; and
the etching gas of the dry etching process includes oxidizing etching gas, fluorine etching gas, or a mixture of oxidizing gas and fluorine etching gas.

17. The method according to claim 16, wherein:
the oxidizing etching gas includes one or more $O_2$, CO, and $SO_2$ mixed with one or more of $H_2$ and $N_2$.

18. The method according to claim 16, wherein:
the fluorine etching gas includes one or more of $Cl_2$, $F_2$, HF, $CF_4$, $C_4F_8$, and $SF_6$.

19. The method according to claim 18, wherein:
a flow of the etching gas of the dry etching process is in a range of approximately 10 sccm to 300 sccm;
a pressure in a reaction chamber of the dry etching process is in a range of approximately 3 mTorr to 200 mTorr; and
a reaction temperature of the dry etching process is a range of approximately 10° C. to 100° C.

20. The method according to claim 19, after forming the to-be-etched patterns, further including:
stripping off the patterned organic distribution layer.

* * * * *